United States Patent [19]

El-Kareh

[11] 4,309,716

[45] Jan. 5, 1982

[54] BIPOLAR DYNAMIC MEMORY CELL

[75] Inventor: Badih El-Kareh, Milton, Vt.

[73] Assignee: International Business Machines Corporation, Armonk, N.Y.

[21] Appl. No.: 87,596

[22] Filed: Oct. 22, 1979

[51] Int. Cl.$^3$ .................... H01L 27/04; H01L 27/02
[52] U.S. Cl. ................................. 357/50; 357/51; 357/92
[58] Field of Search ............................ 357/50, 92, 51

[56] References Cited

U.S. PATENT DOCUMENTS

| | | | |
|---|---|---|---|
| 3,423,255 | 1/1969 | Joyce | 357/49 |
| 3,729,719 | 4/1973 | Wiedmann | 307/238 |
| 3,861,968 | 1/1975 | Magdo et al. | 357/50 |
| 3,938,176 | 2/1976 | Sloan | 357/49 |
| 3,982,266 | 9/1976 | Matzen et al. | 357/50 |
| 3,998,673 | 12/1976 | Chow | 357/50 |
| 4,084,174 | 4/1978 | Crippen et al. | 357/50 |
| 4,190,466 | 2/1980 | Bhattacharyya et al. | 357/50 |

OTHER PUBLICATIONS

Jambotkar, "Realization of Large-Value Capacitance Across Base and Collector Terminals of a Bipolar Transistor", IBM Tech. Disclosure Bulletin, vol. 21 (8/78), pp. 1004–1006.

Primary Examiner—Gene M. Munson
Attorney, Agent, or Firm—Francis J. Thornton

[57] ABSTRACT

This describes a novel bipolar dynamic cell array with increased dielectric node capacitance and a method of making it. In the described cell a PNP transistor drives an NPN transistor so that information is stored at the base node capacitance of the PNP transistor. By using the PNP transistor as a read transistor and the NPN as a write transistor, the cell, when made in integrated form, utilizes the cell isolation capacitance to enhance the stored information without increasing the parasitic capacitances in the cell. This cell isolation capacitance can be enhanced by trenching between each cell in the array, oxidizing the trench walls and backfilling the trench with semiconductor material thereby obtaining greater contrast between 0 and 1 signals. This cell is especially useful in memory arrays.

3 Claims, 9 Drawing Figures

BIPOLAR DYNAMIC MEMORY CELL

BACKGROUND OF THE INVENTION

1. Field of the Invention

This invention relates to semiconductor memory cells capacitively storing information and more particularly to an improved memory cell having significantly increased capacitance.

2. Description of the Prior Art

Stored charge memory cells of various types are known to the prior art.

U.S. Pat. No. 3,729,719 describes a storage cell using a PNP-NPN combination coupled together, similar to a silicon controlled rectifier circuit but biased such that the combination is prevented from latching so that data may be stored on the inherent capacitance of the collector-base PN junctions of both the NPN and PNP transistors. The data is detected at the emitter of the NPN device.

U.S. Pat. No. 3,423,225 (Joyce—Westinghouse) teaches an integrated circuit which is totally isolated from the substrate by an oxide layer.

U.S. Pat. No. 3,998,673 (Chow—unassigned) teaches an integrated circuit separated by V-grooves or moats which are coated with an oxide and back filled with polysilicon.

IBM Technical Disclosure Bulletin, Vol. 21, #3, August 1978, on page 1004–1006 describes a process for producing a large value base-collector capacitance for semiconductor transistor using etching and oxidation.

COPENDING APPLICATION

An application Ser. No. 866,126, on which the present inventor was a named inventor and which was assigned to the same assignee as the present invention was filed on Dec. 30, 1977. This application describes a dynamic bipolar memory cell which has the read and write transistors reversed from those shown in the prior art and which employs the base capacitance of the read transistor as the storage node without increasing any parasitic capacitances, present in the cell.

SUMMARY OF THE INVENTION

It is an object of the present invention to provide a more efficient bipolar dynamic cell especially useful as a Random Access Cell.

It is a further object of the present invention to provide a dynamic cell that has a larger storage capacitance.

It is still a further object of the present invention to provide a dynamic cell that has a wider and better amplitude output signal to noise ratio between a stored 1 and 0.

It is an additional object of the present invention to provide a smaller dynamic cell with a more uniform output signal and less signal loss.

It is another object of the present invention to improve the cell such that the cell capacitance is relatively unaffected by tolerances in the devices.

All of these features and advantages are realized when the cell is created in a semiconductor body in integrated form and provided with increased capacitance by forming a trench in the semiconductor material around the cell, ozidizing the walls of the trench and filling the remainder of the trench with semiconductor material connected directly to the substrate.

The foregoing and other objects, features and advantages of the invention will be apparent from the following more particular description of the preferred embodiment of the invention, as illustrated in the accompanying drawings.

DESCRIPTION OF THE PREFERRED EMBODIMENT

Turning now to the figures a full description of the cell of the invention and its mode of operation will be given.

Figure 1:
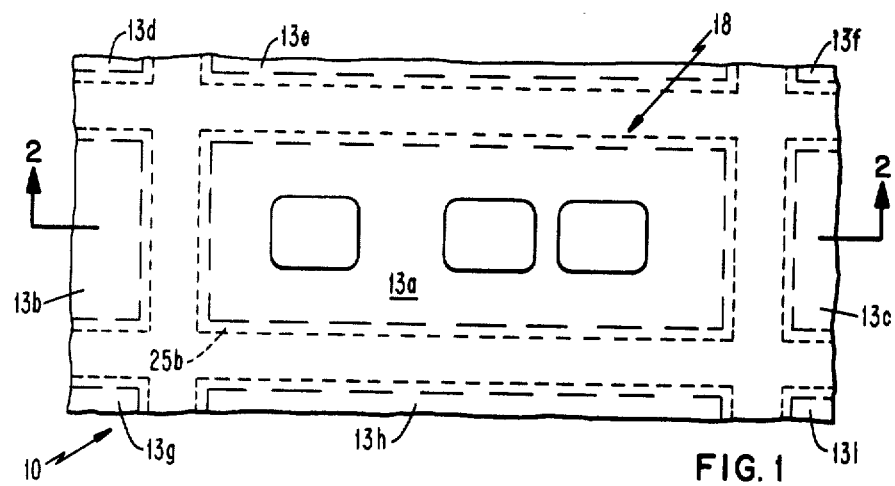
FIG. 1 is a plan view of the surface of an array built, in accordance with the present invention, in integrated circuit form.
Figure 2:
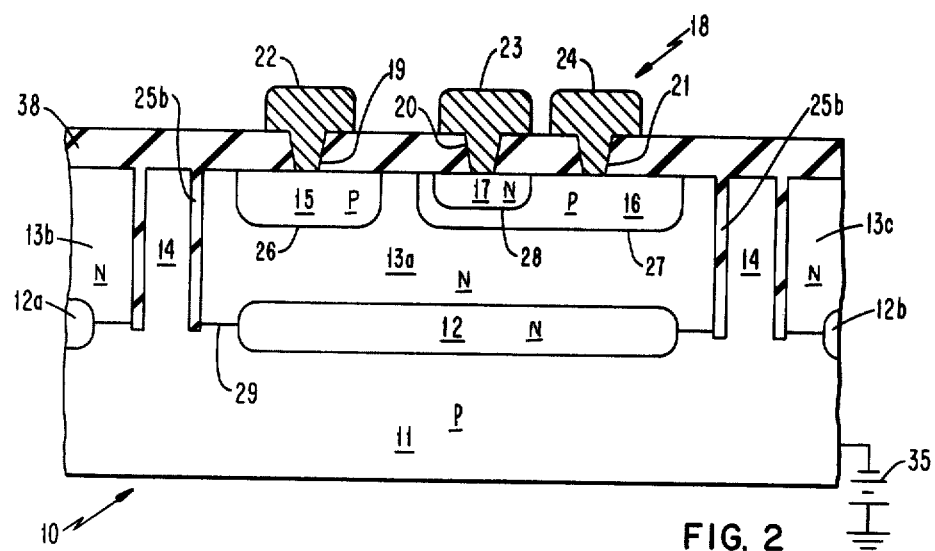
FIG. 2 is a sectional view of the array of FIG. 1 taken along the lines 2—2 of FIG. 1.
Figure 4:
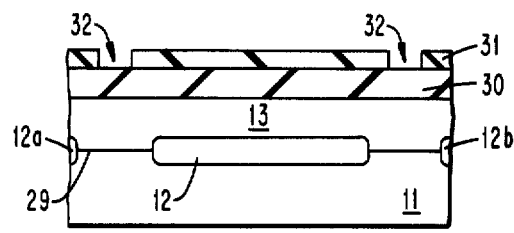
FIGS. 4 through 9 shows the various stages of formation of the improved capacitance of the invention.

Turning especially to FIG. 1, FIG. 2 and FIGS. 4 through 9 there is shown in FIGS. 1 and 2 an array 10 containing a plurality of cells of which only one cell 18 is shown complete. FIGS. 4 through 9 shows the process for making the improved capacitance of the array. This array is created using well known integrated circuit techniques. As shown in FIG. 4 a substrate 11 of semiconductor material, say for example, P-type silicon having a resistivity of about 10 ohm-cm is treated with known diffusion techniques such that there is formed therein a plurality of N+ subcollectors 12, 12a and 12b. If desired a single blanket subcollector can be formed in the substrate. Following creation of these subcollectors an N-type epitaxial layer 13 of the same semiconductor material as the substrate is grown on the substrate. As this epitaxial layer forms, the subcollectors diffuse upward into the epitaxial layer as shown. Thus a rectifying P-N junction 29 is formed between the substrate 11 and the layer 13 and the subcollectors.

Once this layer 13 has been grown to the desired thickness, i.e., usually less than 5 microns thick, the unit is treated as described in the steps below to create an isolation grid which encloses each cell. This grid is formed by cutting a trench through the epitaxial layer, coating the trench walls with a thin oxide and backfilling the trench with silicon. This formed isolation grid is such that it penetrates the entire thickness of the epitaxial layer so that the back-filled silicon merges with the P-type substrate. Thus the isolation grid completely surrounds and isolates each formed subcollector region and defines islands in the epitaxial layer overlaying each subcollector region. In the case where a single subcollector is used the trench must cut through the subcollector into the substrate.

Once the epitaxial region 13 is fully grown it is coated with a thick oxide 30 which in turn is coated with a photoresist layer 31. The oxide layer 30 must be at least approximately 20% of the thickness of the epitaxial layer.

Figure 5:
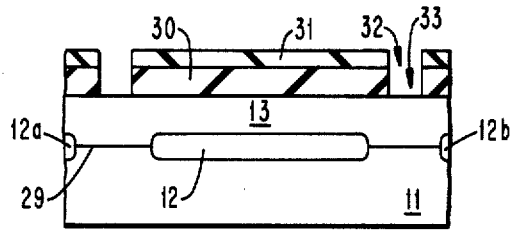

As shown in FIG. 5 the photoresist layer 31 is then exposed and developed using the well known photolithographic techniques to create an opening 32 therein. This opening 32 is formed with a gridlike pattern so as to lay out in the photoresist layer 31 the final combination of the isolation grid to be formed in the layer 13. Through this formed opening 32 in the photoresist layer a window 33 is opened in the oxide layer 30 by using a known etching technique such as chemical etching.

Figure 6:
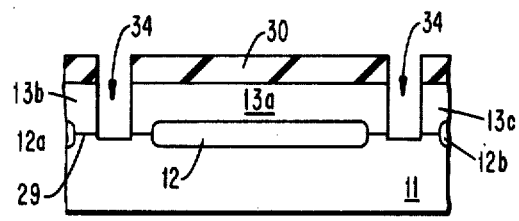

Once the window 33 is created in the oxide layer 30 the photoresist layer 31 is removed and the unit is placed in a reactive ion etching chamber. One ion etching process comprises the introduction of reactive material, such as hydrochloric acid at a temperature of approximately 200° C. in vapor form into the chamber with the device to be etched. This vapor is ionized using a plasma so that reactive ions of the reactive material, i.e., the hydrochloric acid, are formed. These ions are then directed against the surface of the device which is to be etched. This technique creates as shown in FIG. 6 a straight, vertically walled trench 34 in the epitaxial layer 13 under the oxide window 33. Thus the entire isolation grid 14 now exists in the body as a single open interconnected trench 34. To assure complete isolation of each cell it is necessary that this trench 34 cut completely through the epitaxial layer 13 and the P-N junction 29 formed between the epitaxial layer 13 and the substrate 11. Totally isolated islands 13a, 13b, 13c, 13d, 13e, 13f, 13g, 13h and 13I of epitaxial material are thus formed as shown in FIG. 1 and FIG. 6.

Figure 7:
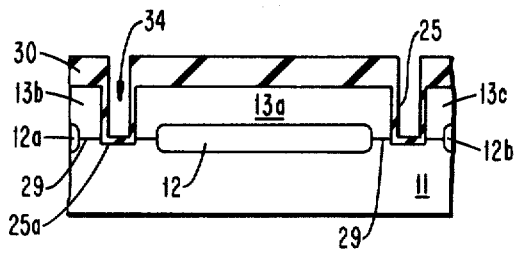
Figure 8:
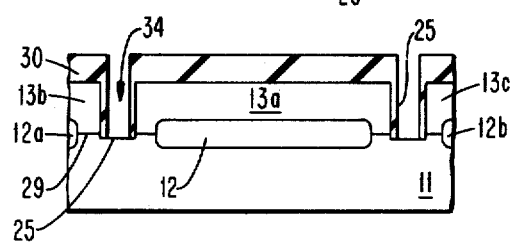

Once this trench 34 is formed the unit is removed from the reactive ion etching apparatus and placed in an oxidizing chamber into which a gas comprised of a carrier gas and 5% dry oxygen is passed over it. The carrier gas may be nitrogen or argon or other such natural gas or combination thereof. The unit is thermally heated to 1100° C. in this oxidizing chamber and maintained in the chamber at this temperature for a length of time sufficient to create upon the exposed silicon, i.e., the walls and the bottom of the trench 34, as shown in FIG. 7, a layer of silicon dioxide 25 this oxide layer 25 may range from 200 angstroms in thickness to 500 angstroms in thickness and is shown in FIG. 7. Once the walls of the trench has been lined with the thermal oxide layer 25 the unit is removed from the thermal oxidation chamber and placed once again into the reactive ion chamber. The reactive ion process, above described, is again repeated for a time sufficient to remove the oxide coating 25a on the bottom of the trench 34. Thus separating the oxide 25 on the walls of each island from the walls on every other island as shown in FIG. 1 and FIG. 8.

This reactive ion etching process reduces the thickness of surface oxide layer 30 by an amount equal to the thickness of the oxide layer 25a removed from the bottom of the trench 34.

Because the reactive ion etching process is a direct line of sight process the effect of it on the oxide 25 on side of the trench is insignificant and for all effects and purposes that material remains substantially untouched and undiminished in thickness.

Figure 9:
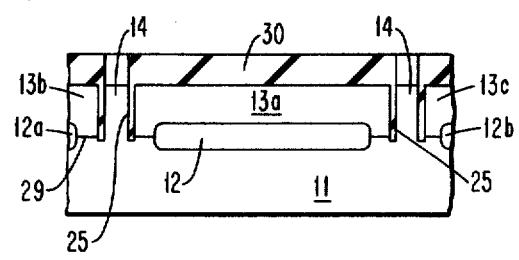

Once the oxide material 25a, in the bottom of the trench, has been removed the unit is placed into a chemical vapor deposition apparatus and exposed to a silicon containing vapor such as silane or silicontetrachloride mixed with a dopant material such as boron. By using this well known chemical vapor deposition a p-doped silicon grid 14 can be formed in the trench 34 as shown in FIG. 9. This silicon material 14, which may be polycrystalline or single crystal material, because of removal of the oxide 25a at the bottom of the trench 34, merges with and forms a good electrical connection with the substrate 11. Any excess material formed over and above the surface of the trench can be easily removed by well known techniques.

In this way there is formed an oxide lined, silicon filled grid. The silicon fill material 14 in the grid makes a good electrical connection with the substrate 11 but remains isolated, by a wall of oxide 25, from each formed island 13a, 13b, 13c, 13d, 13e, 13f, 13g, 13h and 13i.

Subsequently as shown in FIG. 2, two P-type regions 15 and 16 are formed by well known diffusion techniques in the upper surface of island 13a. Region 15 forms a PN junction 26 with the underlying N-type epitaxial island 13a. Region 16 forms a similar PN junction 27 with the island 13a. Thereafter an N-type diffusion 17 is formed inside the perimeter of P-type diffusion 16 to form a PN junction 28 with region 16. Once these diffusions are complete the entire surface of the array is provided with a layer 38 of silicon dioxide approximately 3000 Å thick. Through this layer three different windows or via holes 19, 20 and 21 are formed over the respective diffusions 15, 16 and 17 in each island. Conductive material, i.e., aluminum dots 22, 23 and 24, is then placed in the windows to make contact with the respective underlying regions 15, 16 and 17. This forms in each island a single integrated PNP-NPN transistor cell 18 shown schematically in FIG. 3.

Figure 3:
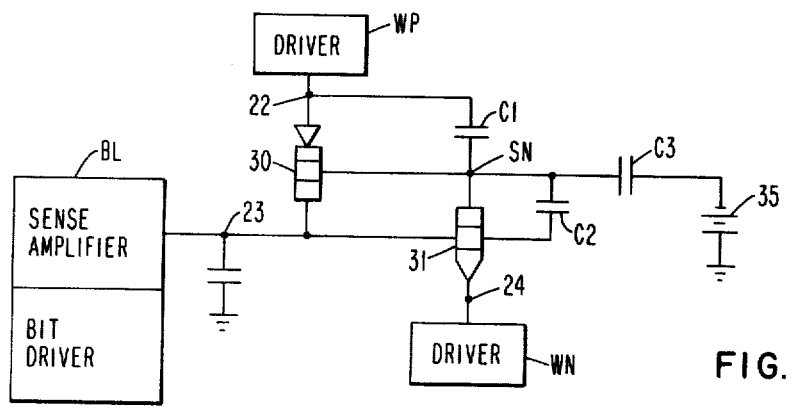
FIG. 3 is a schematic of the array shown in FIG. 1 and FIG. 2.

The PNP transistor 30, shown schematically in FIG. 3 is thus comprised of region 15, which serves as its emitter, region 16 which serves as its collector and that portion of the undiffused island 13a lying therebetween which serves as its base.

The NPN transistor 31 is defined by region 17 which serves as its emitter, region 16 which functions as its base and region 13a which together with subcollector 12 functions as its collector.

When the cell is to be operated in an array it is necessary that a first driver circuit WP be coupled through a read line to the contact 22. This is shown schematically in FIG. 3 where the contact 22 is shown as a node and serves as a read line contact. A second driver circuit WN is coupled to the contact 24 which serves as a write line contact. These driver circuits may be any known prior art circuits capable of applying suitable voltage pulses to the respective read and write lines. Thus the PNP transistor 30 is used as a read transistor and the NPN transistor 31 is used as the write transistor. A known sense amplifier/bit driver circuit BL is coupled to the contact 23 which functions as a bit line contact.

The capacitor C1 shown across the emitter and base of the PNP transistor 30 illustrates the junction capacitance of the PN junction 26. The capacitor C2 shown across the base and collector of the NPN transistor 31 illustrates the junction capacitance of PN junction 27. The capacitance C3 illustrates the combined capacitance of the junction capacitance of PN junction 29 and of the oxide coating 25b which isolates the island 13a from the silicon grid 14. The island 13a is the plate of the capacitor C3 shown connected to the base of the PNP transistor 30. The substrate 11 and grid 14 serve as the other plate of the capacitor C3 and are coupled to a fixed potential illustrated by battery 35. Each of these capacitors C1, C2 and C3 thus enjoys a common reference point, i.e., the defined epitaxial island 13a. In the present invention, it is this region 13a in which the information is stored.

Capacitance C1 and C2 are both small with respect to capacitor C3. Capacitor C3 is many times larger than capacitor C1. Capacitance C1 and C2 track one another, i.e., have the same relative characteristics because both are depletion capacitances between simultanously diffused P regions 15 and 16 and the defined N-type expitaxial island 13a.

This region 13a in which charge storage occurs is illustrated schematically at the common junction SN of the three capacitors C1, C2 and C3.

Many benefits are realized by making the capacitor C3 even larger by addition of the oxide layer 25b. This improved device has a better output signal to noise amplitude ratio between a 0 and a 1; and less signal loss and, during reading of the cell, the effect of capacitor C1 is even further reduced.

Because the read operation in this cell is destructive, i.e., the data is reset to a 0 regardless of its previous condition, it is necessary to regenerate or write the cell after every read operations.

Initially it will be assumed for purposes of illustration only, that the storage node SN is at 0.9V, that is the storage node is effectively discharged. Because the read operation is destructive a read operation will be performed before any write operations are performed to assure that the cell is in a known state.

During reading driver WP is caused to rise from ground or zero volts to 4.0 volts thus applying a positive 4.0 volts pulse to the node 22 and the emitter of the PNP transistor 30. Simultaneously the driver WN is held at its quiescent voltage of 1.3 volts. These applied voltages turn on the PNP transistor 30 and charge flows through the PNP emitterbase junction and causes the storage node SN to charge, from its discharged state of 0.9 volts, to its charged state of 3.2 volts. Since the read pulse remains at 4.0 volts after the storage node SN reaches 3.2 volts, transistor 30 remains on and charge flows through the collector of the PNP transistor 30 to charge the bit line from 1.1 volts to 1.2 volts. This voltage change on the bit line is detected by the bit line sense amplifier BL. Because the charge flow across the emitter-base junction of the PNP transistor is equal to the Beta of the PNP transistor times the charge transferred to its base, the cell can now be made smaller. This Beta amplification assures that a detectable signal level can be realized. This read period is terminated by bringing the driver circuit WP back to zero volts. The write 1 operation is initiated by holding WP at zero volts and setting the bit line to 0.8 volts by the bit driver portion of the circuit BL and pulling WN down from its quiescent voltage of 1.3 volts to a level of 0.1 volts causing the transistor 30 to conduct the storage node SN to be discharged to 0.9 volts. When the write driver WN returns to its quiescent voltage of 1.3 volts the bit line voltage is reset to 1.1 volts by bit driver BL. By discharging the storage node, a 1 has been written into the cell.

Following this writing of a 1 on the cell, it may be read by applying a 4.0 volt pulse from the read driver WP on the emitter of device 30 while holding the write driver WN at its quiescent voltage of 1.3 volts. Once again this causes the storage node SN to charge and it rises to 3.2 volts. Simultaneously the bit line BL begins to charge to 1.2 volts. This 0.1 voltage change on the bit lines, detected by the bit line sense amplifier, indicates a 1 was stored therein.

Because this read pulse is destructive and causes the storage node to charge to 3.2 volts it effectively writes a 0 into the cell. However, because of design considerations it is necessary to perform a write cycle sequential to a read cycle. In this case, called for convenience, a write 0, the read driver WP is held at zero volts, the write driver WN is pulled down to 0.1 volts. In this instance, however, because the bit line is held at 0.1 volts by the bit driver the NPN transistor 31 is prevented from conducting and there is no change in the state of the storage node SN because it was previously charged by the read 1 cycle and it remains at 3.2 volts.

It is necessary to pull the bit line down to 0.1 volts to assure that the NPN transistor 31 is not turned on and a 1 is not inadvertently written into the cell. When the write driver pulse terminates the bit line BL is restored to the normal level of 1.1 volts by the bit driver circuit portion of the bit line sense amplifier/bit driver circuit BL.

Again to read the stored zero the read driver WP is raised to 4.0 volts. However, because the storage node SN is fully charged, transistor 30 does not turn on and no change in the state of the storage node or in the state of the bit line BL occurs indicating that a 0 has been stored in the storage node of the cell.

While the invention has been particularly shown and described with reference to the particular embodiment thereof, it will be understood by those skilled in the art that changes may be made therein without departing from the spirit and scope thereof.

What is claimed is:

1. A semiconductor array having enhanced capacitance comprising:
   a body of semiconductor material of a first conductivity type having a surface,
   a plurality of isolated mesas of a second conductivity type material on said surface,
   each of said mesas having substantially vertical side walls extending from said surface,
   each of said mesas forming a rectifying junction with said body,
   a circumferential coating of insulating material having a thickness of less than 500 angstroms on each of the side walls of each of said mesas, and
   a plurality of orthognal, substantially vertical ridges of conductive material extending from and in good electrical contact with said surface, between and surrounding said mesas and contacting said insulating material,
   each of said mesas including a transistor formed therein, and
   each of said mesas forming the first plate of a capacitor coupled to the transistor therein, said body and said conductive ridges surrounding said mesas forming the second plate of said capacitor and the rectifying junction between the mesas and the body and said circumferential coating of said insulating material isolating said first plate from said second plate of said capacitor.

2. The array of claim 1 wherein said semiconductor material comprises silicon and said insulating material comprises silicon dioxide.

3. The array of claim 1 wherein each of said mesas comprises first, second, third and fourth regions,
   said first and third regions being of said first conductivity type and separated by said second region,
   said second and fourth regions being of said second conductivity type,
   said fourth region being isolated from said first and second regions by said third region,
   said first, second and third regions forming the emitter, base, and collector of a first transistor,
   said second, third, and fourth regions forming the collector, base and emitter of a second transistor,
   said first and second transistors being complementary transistors, and
   said insulating material is in contact with said second region.

* * * * *